US012610702B2

(12) United States Patent
Bang et al.

(10) Patent No.: US 12,610,702 B2
(45) Date of Patent: Apr. 21, 2026

(54) DISPLAY DEVICE

(71) Applicant: Samsung Display Co., LTD., Yongin-si (KR)

(72) Inventors: Hyun-Chol Bang, Seongnam-si (KR); Dae Suk Kim, Seongnam-si (KR); Yanghee Kim, Hwaseong-si (KR); Young-Soo Yoon, Seoul (KR); Il Goo Youn, Anyang-si (KR); Bong Won Lee, Seoul (KR); So Young Lee, Anyang-si (KR); Sukyo Jung, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 566 days.

(21) Appl. No.: 18/097,135

(22) Filed: Jan. 13, 2023

(65) Prior Publication Data

US 2023/0240105 A1     Jul. 27, 2023

(30) Foreign Application Priority Data

Jan. 25, 2022    (KR) ........................ 10-2022-0010684

(51) Int. Cl.
*H10K 59/131* (2023.01)
*G01R 31/28* (2006.01)
*H10P 74/00* (2026.01)

(52) U.S. Cl.
CPC ....... *H10K 59/131* (2023.02); *G01R 31/2884* (2013.01); *H10P 74/273* (2026.01)

(58) Field of Classification Search
CPC .. H10K 59/131; H10K 71/70; G01R 31/2884; H01L 22/32; G09G 3/006; G09G 3/3208
See application file for complete search history.

(56) References Cited

U.S. PATENT DOCUMENTS

| | | | | | |
|---|---|---|---|---|---|
| 7,808,267 | B2 * | 10/2010 | Lee | ........................ | G09G 3/006 |
| | | | | | 324/762.08 |
| 9,275,932 | B2 * | 3/2016 | Yoshida | ................... | H01L 23/48 |
| 11,501,706 | B2 | 11/2022 | Keum et al. | | |
| 12,224,215 | B2 * | 2/2025 | Huang | ................... | G09G 3/006 |
| 2018/0150162 | A1 * | 5/2018 | Kim | .................... | G06F 11/2221 |

(Continued)

FOREIGN PATENT DOCUMENTS

| | | |
|---|---|---|
| KR | 101486038 | 1/2015 |
| KR | 1020200010697 | 1/2020 |

(Continued)

*Primary Examiner* — Jarrett J Stark
(74) *Attorney, Agent, or Firm* — CANTOR COLBURN LLP

(57) ABSTRACT

A display device includes a substrate including a first display area, a second display area, and a non-display area, a plurality of first signal lines extending in a first direction and disposed in the first display area, a plurality of second signal lines extending from the non-display area in the first direction and disposed in the second display area, a plurality of connection lines connected to the first signal lines and extending to the non-display area via the first display area and the second display area, and a test circuit portion disposed in the non-display area. At least some of the plurality of connection lines and at least some of the second signal lines are electrically the test circuit portion.

20 Claims, 15 Drawing Sheets

(56) References Cited

U.S. PATENT DOCUMENTS

| | | | |
|---|---|---|---|
| 2020/0394967 A1 | 12/2020 | Park et al. | |
| 2021/0028250 A1* | 1/2021 | Wu | H10K 59/88 |
| 2021/0210482 A1* | 7/2021 | Zhang | H10D 89/611 |
| 2021/0366330 A1* | 11/2021 | Huang | G09G 3/2092 |
| 2022/0115280 A1* | 4/2022 | Du | H01L 22/34 |
| 2022/0115464 A1* | 4/2022 | Han | H10K 71/70 |
| 2022/0208093 A1* | 6/2022 | Keum | G09G 3/3225 |
| 2022/0254285 A1* | 8/2022 | Wang | G09G 3/006 |
| 2022/0320241 A1* | 10/2022 | Zhou | G01R 31/2884 |
| 2022/0328599 A1* | 10/2022 | Zhang | G01R 31/2884 |
| 2022/0343843 A1* | 10/2022 | Du | G09G 3/3233 |
| 2024/0004494 A1* | 1/2024 | Bang | G06F 3/04164 |
| 2024/0047851 A1* | 2/2024 | Feng | H01Q 1/243 |
| 2024/0213425 A1* | 6/2024 | Wang | H01L 25/167 |
| 2024/0321652 A1* | 9/2024 | Kang | G01R 31/2884 |

FOREIGN PATENT DOCUMENTS

| | | | |
|---|---|---|---|
| KR | 1020200017012 | | 2/2020 |
| KR | 1020200143558 | A | 12/2020 |
| KR | 20210089565 | A | 7/2021 |
| KR | 1020220094300 | | 7/2022 |

* cited by examiner

DISPLAY DEVICE

DISPLAY DEVICE

This application claims priority to Korean Patent Application No. 10-2022-0010684, filed on Jan. 25, 2022, and all the benefits accruing therefrom under 35 U.S.C. § 119, the content of which in its entirety is herein incorporated by reference.

BACKGROUND

(a) Field

Embodiments of the disclosure relate to a display device, and more particularly, to a display device capable of checking a defect over an entire display area.

(b) Description of the Related Art

A display device is a device that displays an image, and includes a display panel such as a light-emitting display panel or a liquid crystal display panel. A light-emitting diode display ("OLED display") is a type of a self-luminous display device. The OLED display includes an emission layer provided between an anode and a cathode. When the two electrodes, i.e., the anode and the cathode, inject electrons and holes into the light-emitting layer, respectively, excitons are generated depending on a combination of the electrons and the holes, and as these excitons fall from an excited state to a ground state, light is generated.

A display device using a chip on plastic ("COP") or chip on glass ("COG") method for directly attaching a driving integrated circuit to a substrate includes a chip mounting area to which a driving integrated circuit is bonded. The chip mounting area may include a plurality of output pads formed to be electrically connected to an output bump of the driving integrated circuit, and a plurality of input pads formed to be electrically connected to the input bump of the driving integrated circuit to supply a signal from the outside to the driving integrated circuit.

In addition, the driving integrated circuit may perform a pixel defect inspection depending on a display panel manufacturing process of the display device. In the pixel defect inspection, resistance, capacitance, or driving status of the display panel is inspected by applying an inspection signal to the display panel in a state in which the driving integrated circuit is not mounted in the chip mounting area.

SUMMARY

Embodiments have been made in an effort to provide a display device that inspects whether or not there is a defect in an entire display area.

An embodiment of the invention provides a display device including a substrate including a first display area, a second display area, and a non-display area, a plurality of first signal lines extending in a first direction and disposed in the first display area, a plurality of second signal lines extending from the non-display area in the first direction and disposed in the second display area, a plurality of connection lines connected to the plurality of first signal lines and extending to the non-display area via the first display area and the second display area, and a test circuit portion disposed in the non-display area. At least some of the plurality of connection lines and at least some of the plurality of second signal lines are electrically connected to the test circuit portion.

In an embodiment, the plurality of first signal lines may include a first-1 sub-signal line connected to a first pixel emitting a first color, a first-2 sub-signal line connected to a second pixel emitting the second color, and a first-3 sub-signal line connected to a third pixel emitting a third color, the plurality of second signal lines may include a second-1 sub-signal line connected to a first pixel emitting the first color, a second-2 sub-signal line connected to a second pixel emitting the second color, and a second-3 sub-signal line connected to a third pixel emitting the third color, a first signal line unit in which the first-1 sub-signal line, the first-2 sub-signal line, the first-3 sub-signal line, and the first-2 sub-signal line are disposed may be repeatedly disposed in the first display area, and a second signal line unit in which the second-1 sub-signal line, the second-2 sub-signal line, the second-3 sub-signal line, and the second-2 sub-signal line are disposed may be repeatedly disposed in the second display area.

In an embodiment, one sub-signal line of the first signal line unit and one second signal line unit may be connected to the test circuit portion.

In an embodiment, one first-2 sub-signal line included in the first signal line unit and one second-2 sub-signal line included in the second signal line unit may be connected to the test circuit portion.

In an embodiment, the first-1 sub-signal line of the first signal line unit and the second-1 sub-signal line of the second signal line unit may be connected to the test circuit portion.

In an embodiment, the first-3 sub-signal line of the first signal line unit and the second-3 sub-signal line of the second signal line unit may be connected to the test circuit portion.

In an embodiment, the two first-2 sub-signal lines included in the first signal line unit and the two second-2 sub-signal lines included in the second signal line unit may be connected to the test circuit portion.

In an embodiment, the first-1 sub-signal line and the first-3 sub-signal line included in the first signal line unit and the second-1 sub-signal line and the second-3 sub-signal line included in the second signal line unit may be connected to the test circuit portion.

In an embodiment, the first signal line unit is provided in plural, the second signal line unit is provided in plural, and one of the first-1, first-2, first-3 sub-signal lines included in at least two first signal line units and one of the second-1, second-2 and second-3 sub-signal lines included in at least two second signal line units may be connected to the test circuit portion.

In an embodiment, the plurality of connection lines may have different lengths.

In an embodiment, the plurality of connection lines may be spaced apart from each other in the first display area and the second display area, and may not cross each other.

In an embodiment, each of the plurality of connection lines may include a first sub-connection line extending along a second direction that is perpendicular to the first direction, and a second sub-connection line extending along the first direction and connected to the first sub-connection line, and the first sub-connection line may overlap the plurality of second signal lines.

An embodiment of the provides a display device including a substrate including a first display area, a second display area, a third display area, and a non-display area, a plurality of first signal lines extending in a first direction and disposed in the first display area, a plurality of second signal lines extending from the non-display area in the first direction and disposed in the second display area, a plurality of third signal lines extending from the non-display area in the first direction and disposed in the third display area, a plurality of connection lines connected to the plurality of first signal lines and extending to the non-display area via the first display area and the second display area, and a test circuit portion disposed in the non-display area, and at least some of the plurality of connection lines, at least some of the plurality of second signal lines, and at least some of the third signal lines may be electrically connected to the test circuit portion.

In an embodiment, the plurality of connection lines may overlap the first display area and the second display area, and may be spaced apart from the third display area.

In an embodiment, the plurality of first signal lines may include a first-1 sub-signal line connected to a first pixel emitting a first color, a first-2 sub-signal line connected to a second pixel emitting the second color, and a first-3 sub-signal line connected to a third pixel emitting a third color, the plurality of second signal lines may include a second-1 sub-signal line connected to a first pixel emitting the first color, a second-2 sub-signal line connected to a second pixel emitting the second color, and a second-3 sub-signal line connected to a third pixel emitting the third color, the third signal lines may include a third-1 sub-signal line connected to a first pixel emitting the first color, a third-2 sub-signal line connected to a second pixel emitting the second color, and a third-3 sub-signal line connected to a third pixel emitting the third color, a first signal line unit in which the first-1 sub-signal line, the first-2 sub-signal line, the first-3 sub-signal line, and the first-2 sub-signal line are disposed may be repeatedly disposed in the first display area, a second signal line unit in which the second-1 sub-signal line, the second-2 sub-signal line, the second-3 sub-signal line, and the second-2 sub-signal line are disposed is repeatedly disposed in the second display area, and a third signal line unit in which the third-1 sub-signal line, the third-2 sub-signal line, the third-3 sub-signal line, and the third-2 sub-signal line are disposed may be repeatedly disposed in the third display area.

In an embodiment, one of the sub-signal lines of the first signal line unit, one of the sub-signal lines of the second signal line unit, and one of the sub-signal lines of the third signal line unit may be connected to the test circuit portion.

In an embodiment, a plurality of pixels electrically connected to the test circuit portion may emit light of a same color.

In an embodiment, the two first-2 sub-signal lines included in the first signal line unit, the two second-2 sub-signal lines included in the second signal line unit, and the two third-2 sub-signal lines included in the third signal line unit may be connected to the test circuit portion.

In an embodiment, the first-1 sub-signal line and the first-3 sub-signal line included in the first signal line unit, and the second-1 sub-signal line and the second-3 sub-signal line included in the second signal line unit, and the third-1 sub-signal line and the third-3 sub-signal line included in the third signal line unit may be connected to the test circuit portion.

In an embodiment, the first signal line unit is provided in plural, the second signal line unit is provided in plural, third signal line unit is provided in plural, and one of the first-1, first-2, first-3 sub-signal lines included in at least two first signal line units, one of the second-1, second-2 and second-3 sub-signal lines included in at least two second signal line units, and one of the third-1, third-2 and third-3 sub-signal lines included in at least two third signal line units may be connected to the test circuit portion.

By the embodiments, it is possible to provide a display device that performs defect inspection over an entire display area.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which:

FIG. 4 to FIG. 11 each illustrate signal lines disposed in a display area and a non-display area.

FIG. 13 to FIG. 15 each schematically illustrate disposal of signal lines disposed in a display area and a non-display area.

DETAILED DESCRIPTION

Figure 1:
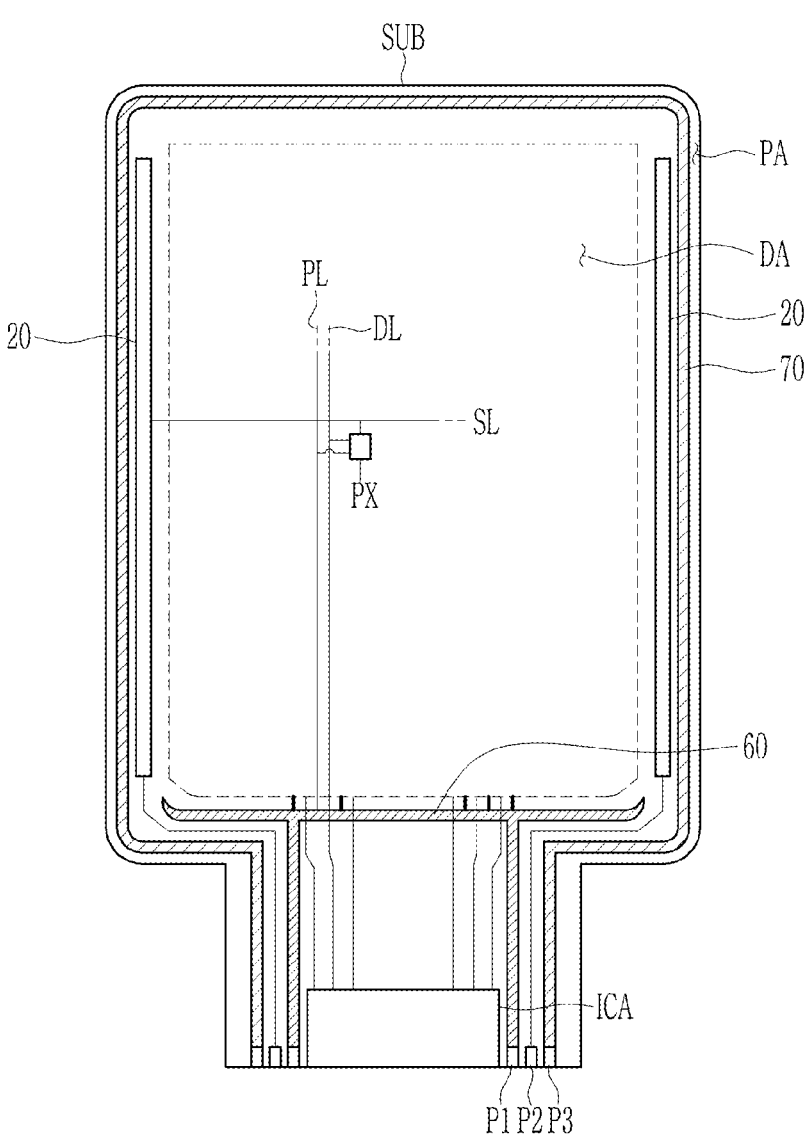
FIG. 1 illustrates a schematic top plan view of an embodiment of a display device.
Figure 1:
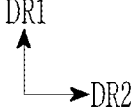

Embodiment of the invention will be described more fully hereinafter with reference to the accompanying drawings, in which embodiments of the invention are shown. As those skilled in the art would realize, the described embodiments may be modified in various different ways, all without departing from the spirit or scope of the invention.

To clearly describe the invention, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Figure 2:
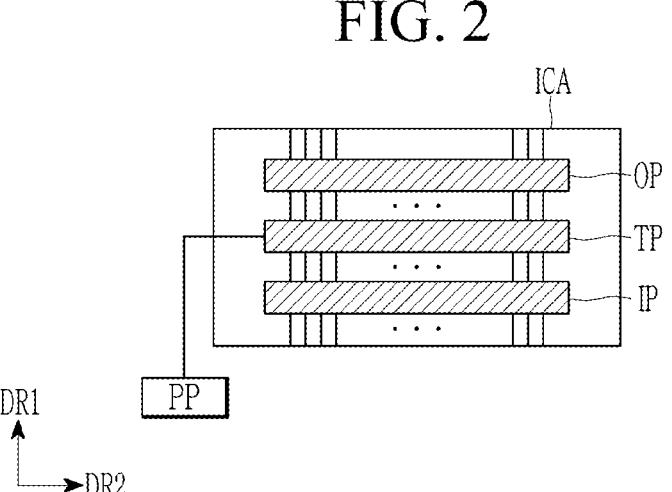
FIG. 2 schematically illustrates a chip mounting area in FIG. 1.
Figure 3:
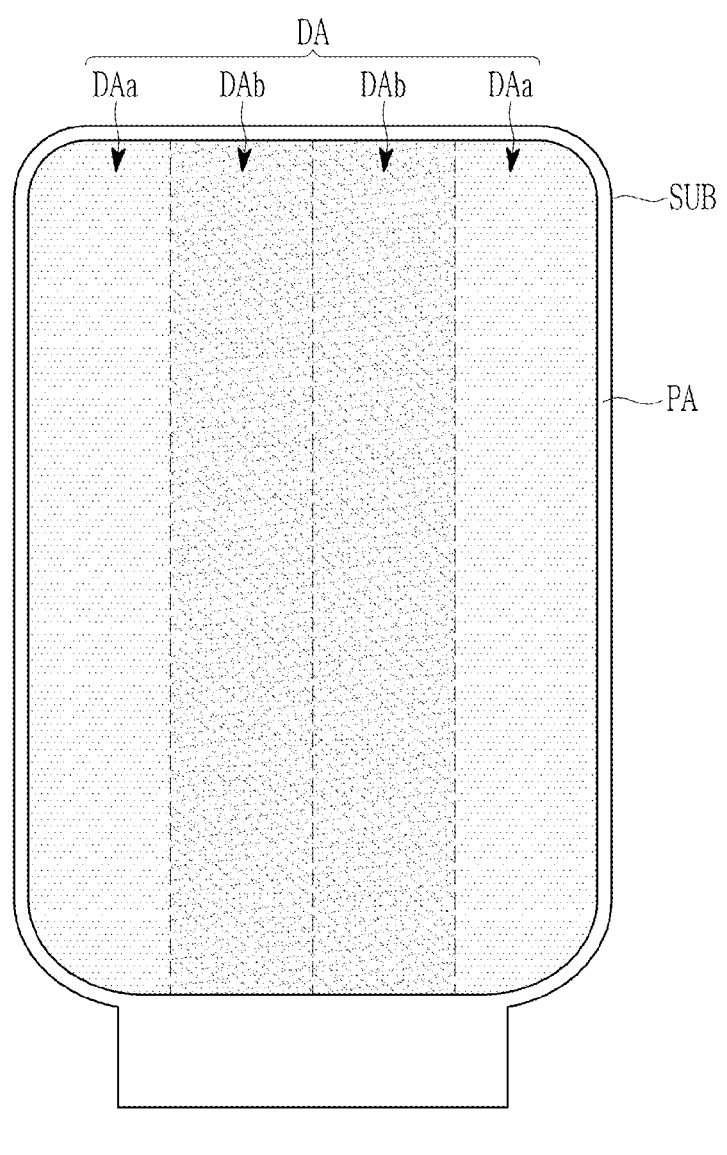
FIG. 3 illustrates a diagram in which regions are divided depending on disposal of signal lines.
Figure 3:
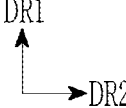

Further, in the specification, the phrase "in a plan view" means when an object portion is viewed from above, and the phrase "in a cross-sectional view" means when a cross-section taken by vertically cutting an object portion is viewed from the side. Hereinafter, a display device in an embodiment will be described with reference to FIG. 1 and FIG. 3. FIG. 1 illustrates a schematic top plan view of an embodiment of a display device, FIG. 2 schematically illustrates a chip mounting area in FIG. 1, and FIG. 3 illustrates a diagram in which a display area is distinguished depending on disposal of signal lines.

Referring to FIG. 1, the display device may include a display area DA and a non-display area PA, and the non-display area PA may be defined along an edge of the display area DA.

The pixels PX may be disposed in the display area DA. Each of the pixels PX includes a light-emitting element and a pixel circuit unit connected thereto. In an embodiment, each of the pixels PX emits, e.g., red, green, blue, or white light, and may include, e.g., an organic light-emitting diode. However, the invention is not limited thereto, and each of the pixels PX may emit different color light and may include various other light-emitting elements.

The display device may include a plurality of signal lines and a pad portion. The signal lines may include a scan line SL extending in a second direction DR2, and a data line DL and a driving voltage line PL extending in a first direction DR1.

The scan driver 20 is disposed at left and right sides of the display area DA, and generates and transfers a scan signal to each pixel PX through the scan line SL. The pixel PX may receive scan signals together from the two scan drivers 20 disposed on the left and right sides. However, the invention is not limited thereto, and in another embodiment, the scan driver 20 may be disposed on one of the left and right sides or at least one of upper sides and lower sides.

A plurality of terminals P1, P2, and P3 may be disposed at a first end of a substrate SUB overlapping the non-display area PA. The terminals P1, P2, and P3 may be exposed without being covered by an insulating layer to be electrically connected to a flexible printed circuit board (not illustrated).

The first terminal P1 may transfer a driving voltage to a driving voltage supply line 60. The second terminal P2 may receive a vertical synchronization signal, a horizontal synchronization signal, and/or a clock signal to transmit a control signal for controlling the driving of the scan driver 20, and the third terminal P3 may transmit a common voltage to each common voltage supply line 70.

The driving voltage supply line 60 is disposed on the non-display area PA. In an embodiment, the driving voltage supply line 60 may be disposed between a chip mounting area ICA and the display area DA, for example. The driving voltage supply line 60 provides the driving voltage to the pixels PX. The driving voltage supply line 60 may be disposed in the second direction DR2, and may be connected to a plurality of driving voltage lines PL which extend in the first direction DR1.

A common voltage supply line 70 is disposed on the non-display area PA. The common voltage supply line 70 may have a shape surrounding the substrate SUB. The common voltage supply line 70 transfers the common voltage to one electrode (e.g., cathode) of a light-emitting element included in the pixel PX.

The non-display area PA in an embodiment may include the chip mounting area ICA to which a driving integrated circuit ("IC") (not shown) is bonded. In the chip mounting area ICA, the driving IC for driving a plurality of data lines DL to display an image with the pixels PX may be disposed (e.g., mounted). Although the specification has illustrated and described the chip mounting area ICA electrically connected to the data line DL, the specification is not limited thereto, and the driving integrated circuit may be provided to overlap all of the first to third terminals P1, P2, and P3.

The driving IC may be disposed (e.g., mounted) in the chip mounting area ICA after a test process for the pixels PX. The driving IC converts digital input data inputted from a flexible circuit board attached to the substrate SUB into an analog data signal, and supplies the converted data signal to the data lines DL.

As illustrated in FIG. 2, an input pad portion IP and an output pad portion OP on which a driving IC is disposed (e.g., mounted) may be formed or disposed in the chip mounting area ICA.

Referring to FIG. 1 and FIG. 2, the chip mounting area ICA may include an output pad portion OP, an input pad portion IP, and a test circuit portion TP. The chip mounting area ICA may further include a probe pad PP disposed outside. The probe pad PP may supply various test signals provided during the test process to the test circuit portion TP through test signal lines.

The driving IC may be disposed (e.g., mounted) in the chip mounting area ICA after a test process. Although not illustrated, the driving IC may include a plurality of input bumps and a plurality of output bumps.

The input pad portion IP may include a plurality of input pads electrically connected to the input bumps formed or disposed in the driving IC. The output pad portion OP may be electrically connected to the output bumps formed or disposed in the driving IC. The output pad portion OP may be electrically connected to the data lines DL formed or disposed in the display area DA.

The test circuit portion TP may include a plurality of transistors. The transistors may be electrically connected to at least some of some of data lines DL formed or disposed in the display area DA. The data lines DL connected to the test circuit portion TP will be described in more detail with reference to FIG. 4, etc.

Although not illustrated in the specification, a bending portion may be disposed between the chip mounting area ICA and the display area DA. When the non-display area PA is bent, the substrate SUB may be bent based on the bending portion, and a portion of the substrate SUB may be disposed on a rear surface of the substrate SUB.

Hereinafter, the display area DA will be described in more detail with reference to FIG. 3. Referring to FIG. 3, the display area DA may include a first display area DAa and a second display area DAb. The second display area DAb is disposed in a middle of the display area DA based on a center of the display area DA, and the first display area DAa may be disposed at opposite sides of the second display area DAb. A width of the second display area DAb and a width of the first display area DAa may be substantially the same, but the invention is not limited thereto. According to the embodiment, the width of the first display area DAa and the width of the second display area DAb may vary.

The first display area DAa may include a plurality of first signal lines, and the second display area DAb may include a plurality of second signal lines. This will be described with reference to FIG. 4.

Figure 4:
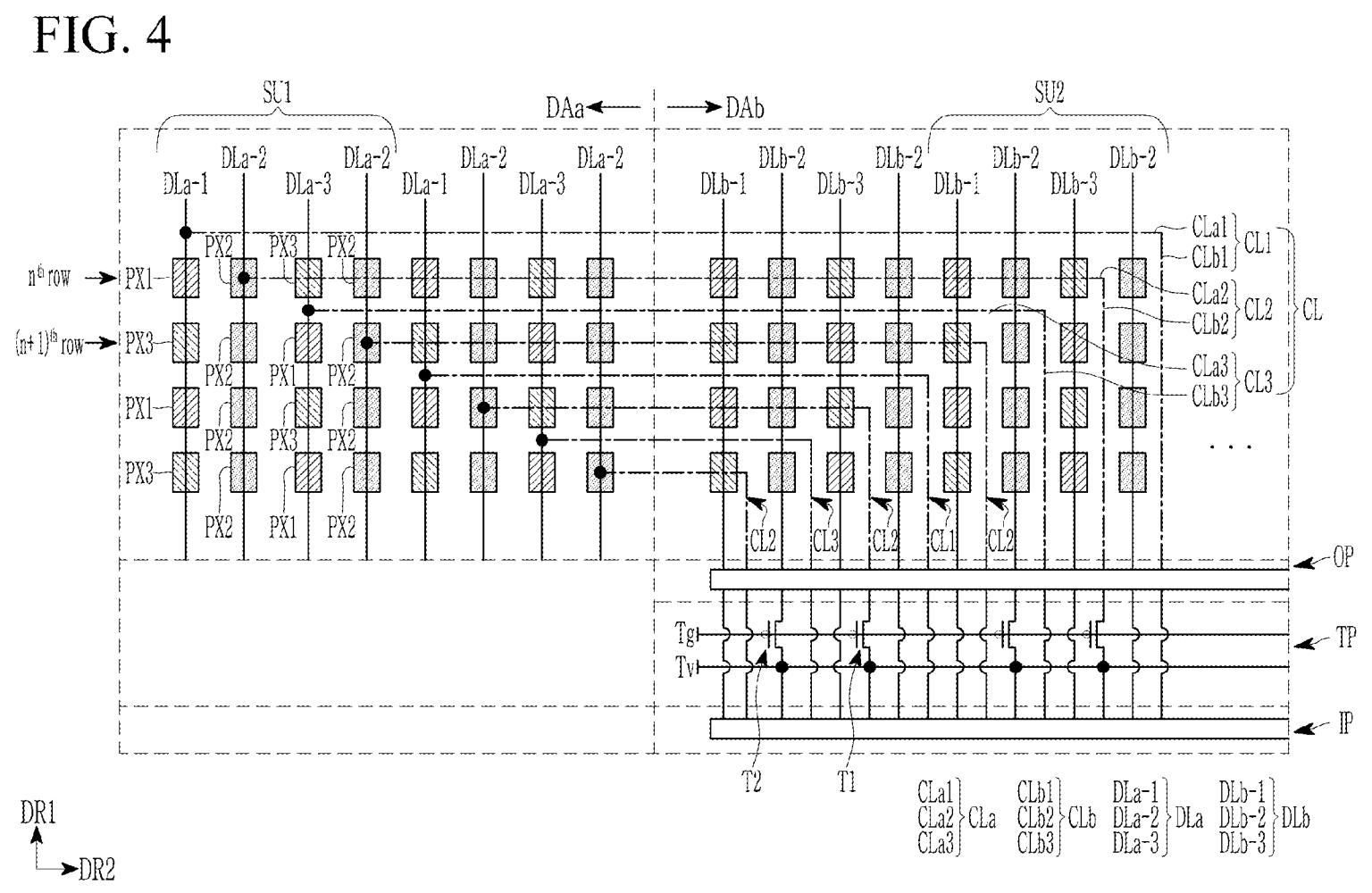

Hereinafter, the signal lines disposed in the display area and the non-display area will be described in more detail with reference to FIG. 4. FIG. 4 illustrates signal lines disposed in a display area and a non-display area.

Referring to FIG. 4, the pixels PX may be disposed in the first direction DR1 and the second direction DR2 in the first display area DAa and the second display area DAb. In an embodiment, a first pixel PX1, a second pixel PX2, a third pixel PX3, and a second pixel PX2 are repeatedly disposed along the second direction DR2 based on an $n^{th}$ row. In addition, the third pixel PX3, the second pixel PX2, the first pixel PX1, and the second pixel PX2 may be repeatedly disposed in a $(n+1)^{th}$ row. The first pixel PX1 is a pixel emitting a first color, the second pixel PX2 is a pixel emitting a second color, and the third pixel PX3 is a pixel emitting a third color. The first color may be red, the second color may be green, and the third color may be blue.

A plurality of first signal lines DLa extending in the first direction DR1 may be disposed in the first display area DAa. The first signal lines DLa may be disposed along the second direction DR2.

The first signal lines DLa may include a first-1 sub-signal line DLa-1 connected to the first pixel PX1 emitting the first color, a first-2 sub-signal line DLa-2 connected to the second pixel PX2 emitting the second color, and a first-3 sub-signal line DLa-3 connected to the third pixel PX3 emitting the third color, based on the $n^{th}$ row.

In the first display area DAa, the first-1 sub-signal line DLa-1, the first-2 sub-signal line DLa-2, the first-3 sub-signal line DLa-3, and the first-2 sub-signal line DLa-2 may be repeatedly disposed. The first-1 sub-signal line DLa-1, the first-2 sub-signal line DLa-2, the first-3 sub-signal line DLa-3, and the first-2 sub-signal line DLa-2 may constitute one first signal line unit SU1. A plurality of first signal line units SU1 may be repeatedly disposed in the first display area DAa.

A plurality of second signal lines DLb extending in the first direction DR1 may be disposed in the second display area DAb. The second signal lines DLb may be disposed along the second direction DR2.

The second signal lines DLb may include a second-1 sub-signal line DLb-1 connected to the first pixel PX1 emitting the first color, a second-2 sub-signal line DLb-2 connected to the second pixel PX2 emitting the second color, and a second-3 sub-signal line DLb-3 connected to the third pixel PX3 emitting the third color, based on the $n^{th}$ row.

In the second area DAb, the second-1 sub-signal line DLb-1, the second-2 sub-signal line DLb-2, the second-3 sub-signal line DLb-3, and the second-2 sub-signal line DLb-2 may be repeatedly disposed. The second-1 sub-signal line DLb-1, the second-2 sub-signal line DLb-2, the second-3 sub-signal line DLb-3, and the second-2 sub-signal line Dlb-2 may constitute one second signal line unit SU2. A plurality of second signal line units SU2 may be repeatedly disposed in the second display area DAb.

In addition, in an embodiment, a connection line CL may be disposed in the first display area DAa and the second display area DAb. The connection line CL may extend to the first display area DAa over the second display area DAb.

The first signal line DLa in an embodiment may be connected to the connection line CL. The connection line CL may include a first sub-connection line CLa extending in the second direction DR2, and a second sub-connection line CLb connected to the first sub-connection line CLa to extend in the first direction DR1. The first sub-connection line CLa may cross the first display area DAa and the second display area DAb. The first sub-connection line CLa may overlap the first signal line DLa and the second signal line DLb. The first sub-connection line CLa may be insulated from a signal line that is not electrically connected thereto, and may overlap the first signal line DLa and the second signal line DLb. The second sub-connection line CLb is disposed in the second display area DAb, and may not overlap other signal lines.

More specifically, the connection line CL may include a first connection line CL1 connected to the first-1 sub-signal line DLa-1, a second connection line CL2 connected to the first-2 sub-signal line DLa-2, and a third connection line CL3 connected to the first-3 sub-signal line DLa-3.

The first connection line CL1 may include a first-1 sub-connection line CLa1 connected to the first-1 sub-signal line DLa-1, and a first-2 sub-connection line CLb1 connected to the first-1 sub-connection line CLa1. The second connection line CL2 may include a second-2 sub-connection line CLa2 connected to the first-2 sub-signal line DLa-2, and a second-2 sub-connection line CLb2 connected to the second-1 sub-connection line CLa2. The third connection line CL3 may include a third-1 sub-connection line CLa3 connected to the first-3 sub-signal line DLa-3, and a third-2 sub-connection line CLb3 connected to the third-1 sub-connection line CLa3.

The connection lines CL may have different lengths from each other. The first connection line CL1, the second connection line CL2, and the third connection line CL3 may have different lengths from each other. In addition, the first connection lines CL1 may have different lengths from each other, the second connection lines CL2 may have different lengths from each other, and the third connection lines CL3 may have different lengths from each other.

The connection lines CL may be spaced apart from each other, and may not overlap. The connection lines CL may be spaced apart from each other in the first display area DAa and the second display area DAb, and may not overlap each other.

Referring to FIG. 4, the second signal line DLb and the connection line CL may be alternately disposed in the non-display area PA. The second-1 sub-signal line DLb-1, the second connection line CL2, the second-2 sub-signal line DLb-2, the third connection line CL3, and the second-3 sub-signal line DLb-3, the second connection line CL2, the second-2 sub-signal line DLb-2, and the first connection line CL1 may be repeatedly disposed based on a left side.

The output pad portion OP, the test circuit portion TP, and the input pad portion IP may be disposed in the non-display area PA. The output pad portion OP and the input pad portion IP may be entirely and electrically connected to the first signal line DLa and the second signal line DLb.

In an embodiment, the test circuit portion TP for performing an inspection on the pixels PX disposed in the first display area DAa and the second display area DAb may be disposed in the peripheral area PA. The test circuit portion TP may check whether the first signal line DLa and the second signal line DLb are short-circuited. The test circuit portion TP may include a test gate line Tg and a test voltage line Tv.

The test circuit portion TP may include the test gate line Tg, the test voltage line Tv, and at least one connection line CL and a first test transistor T1 electrically connected to the first signal line DLa. In addition, the test circuit portion TP may include a test gate line Tg, a test voltage line Tv, and a second test transistor T2 connected to at least one second signal line DLb.

The test voltage line Tv may be disposed to receive a test voltage. While the display panel is tested, the test voltage line Tv may receive a test voltage, and it may be checked whether signal lines connected to the test circuit portion TP operate normally through the test voltage. While the display panel is not tested, the test voltage line Tv may not receive the test voltage. The test voltage line Tv may extend in the second direction DR2. This is only an example, and a shape of the test voltage line Tv may vary depending on a design thereof.

The test gate line Tg may be commonly connected to gates of the first test transistor T1 and gates of the second test transistor T2. The first test transistor T1 and the second test transistor T2 may be testing thin film transistors for checking whether signal lines of the display area DA normally operate during a manufacturing process of the display panel. When the display panel is tested, a plurality of test gate signals for turning on the first test transistor T1 and the second test transistor T2 may be applied to the test gate line Tg.

Hereinafter, signal lines and connection lines electrically connected to the test circuit portion TP among a plurality of signal lines and connection lines will be described.

In an embodiment, any one sub-signal line of one first signal line unit SU1 may be connected to the test circuit portion TP. In an embodiment, one first-2 sub-signal line DLa-2 included in the first signal line unit SU1 may be connected to the test circuit portion TP. The second connection line CL2 electrically connected to the first-2 sub-signal line DLa-2 may be connected to the test circuit portion TP.

In addition, any one sub-signal line of one second signal line unit SU2 may be connected to the test circuit portion TP. In an embodiment, one second-2 sub-signal line DLb-2 included in the second signal line unit SU2 may be connected to the test circuit portion TP.

In the display areas DAa and DAb, one sub-signal line for every four sub-signal lines along the second direction DR2 may be connected to the test circuit portion TP. In this case, the pixels connected to the test circuit portion TP may emit same light, and may be, e.g., the second pixels PX2 emitting light representing the second color.

In an embodiment, the test circuit portion TP may be electrically connected to signal lines disposed in the first display area DAa and signal lines disposed in the second display area Dab, to determine whether each of the signal lines is defective. In an embodiment, the test circuit portion TP may be able to test whether the entire display area is defective, and thus a display device with improved reliability may be provided.

Hereinafter, a display device in an embodiment will be described with reference to FIG. 5 to FIG. 11. FIG. 5, FIG. 6, FIG. 7, FIG. 8, FIG. 9, FIG. 10, and FIG. 11 each schematically illustrate disposal of signal lines in some of a display area and a non-display area. A description of the same or similar constituent elements as those described above will be omitted.

Figure 5:
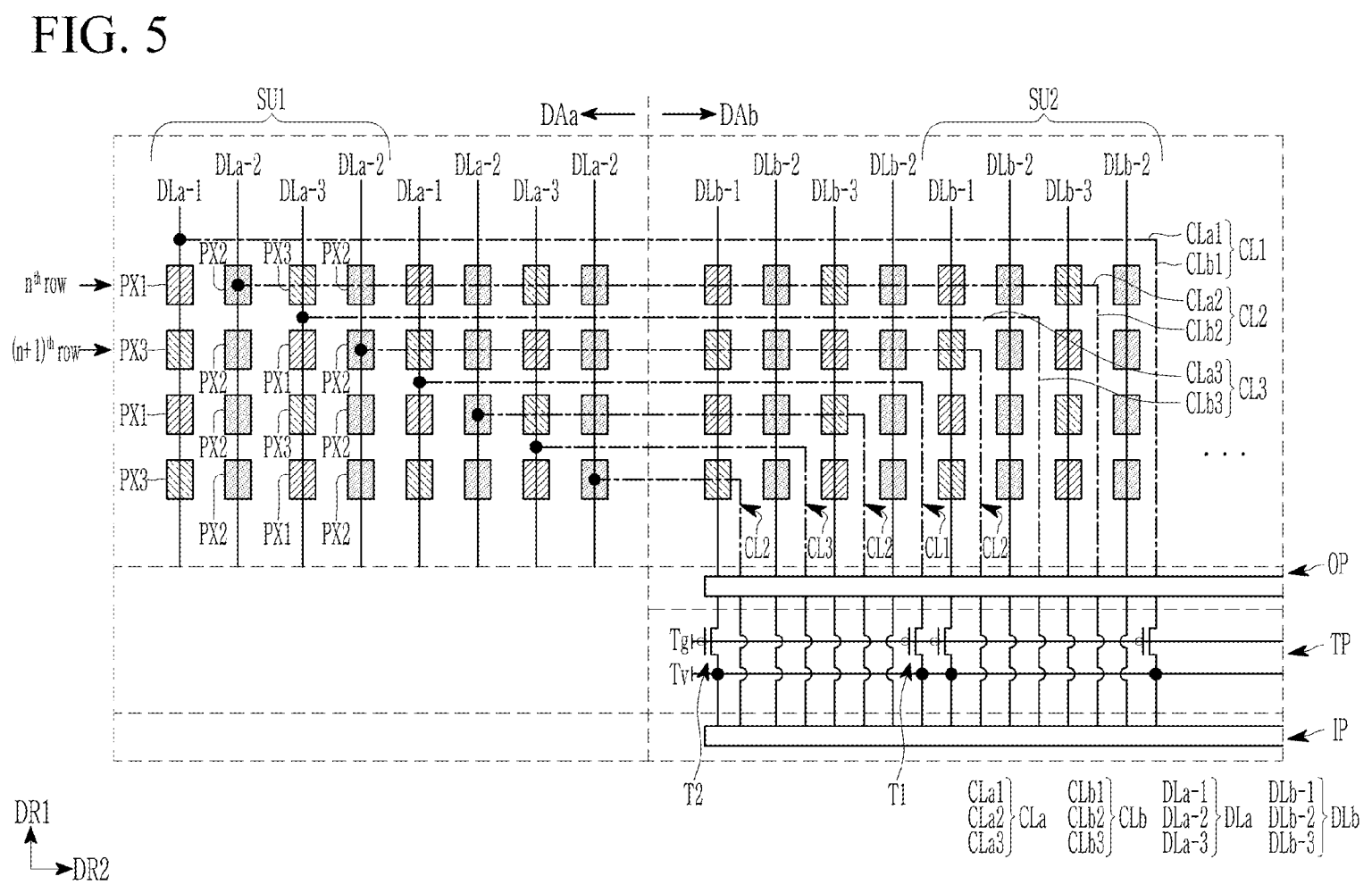

Referring to FIG. 5, in an embodiment, any one sub-signal line of one first signal line unit SU1 may be connected to the test circuit portion TP. In an embodiment, one first-1 sub-signal line DLa-1 included in the first signal line unit SU1 may be connected to the test circuit portion TP. The first connection line CL1 electrically connected to the first-1 sub-signal line DLa-1 may be connected to the test circuit portion TP.

In addition, any one sub-signal line of one second signal line unit SU2 may be connected to the test circuit portion TP. In an embodiment, one second-1 sub-signal line DLb-1 included in the second signal line unit SU2 may be connected to the test circuit portion TP.

In an embodiment, in the display areas DAa and DAb, one sub-signal line for every four sub-signal lines along the second direction DR2 may be connected to the test circuit portion TP.

Figure 6:
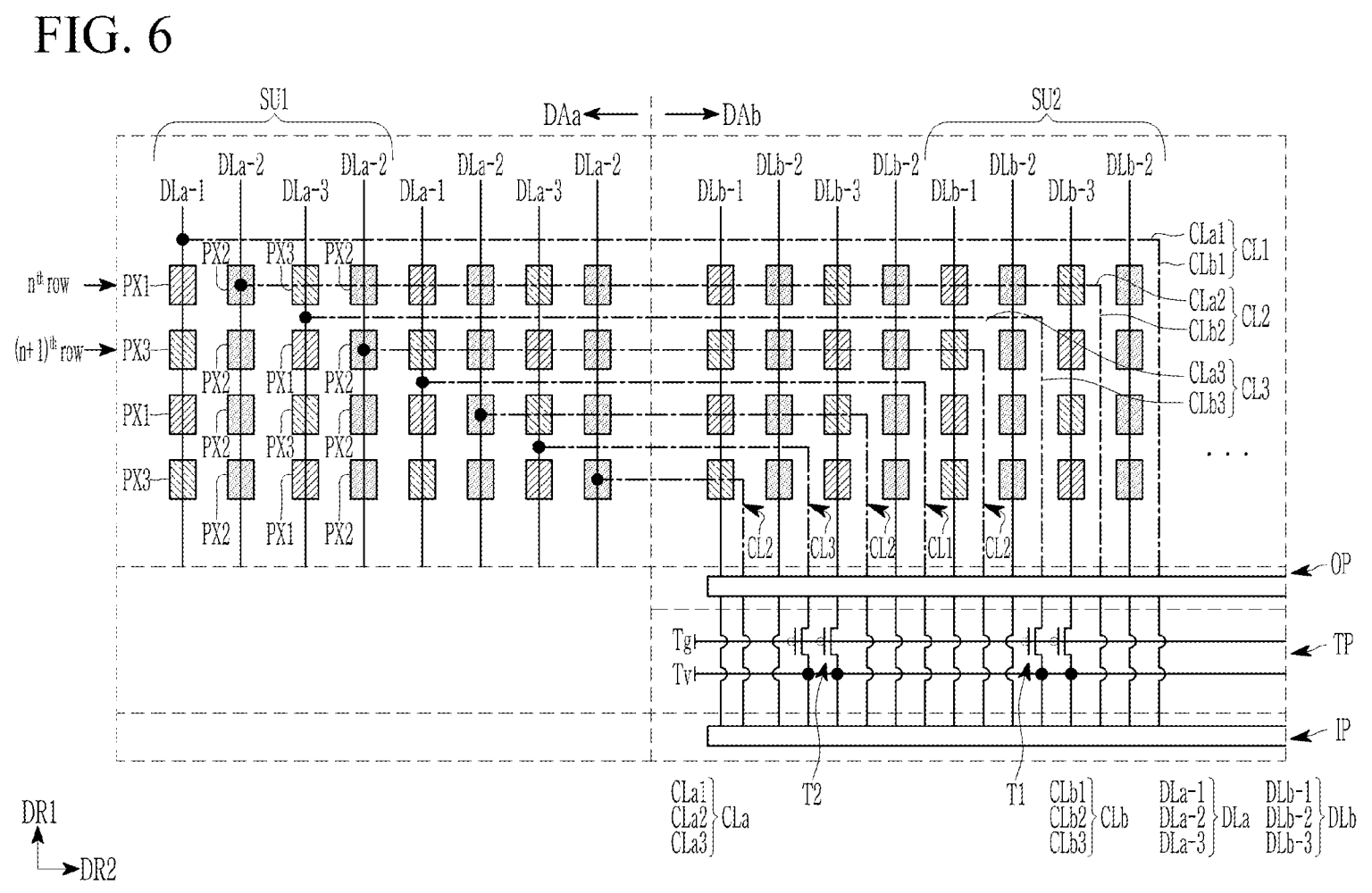

Next, referring to FIG. 6, in an embodiment, any one sub-signal line of one first signal line unit SU1 may be connected to the test circuit portion TP. In an embodiment, one first-3 sub-signal line DLa-3 included in the first signal line unit SU1 may be connected to the test circuit portion TP. The third connection line CL3 electrically connected to the third-3 sub-signal line DLa-3 may be connected to the test circuit portion TP.

In addition, any one sub-signal line of one second signal line unit SU2 may be connected to the test circuit portion TP. In an embodiment, one second-3 sub-signal line DLb-3 included in the second signal line unit SU2 may be connected to the test circuit portion TP.

In an embodiment, in the display areas DAa and DAb, one sub-signal line for every four sub-signal lines along the second direction DR2 may be connected to the test circuit portion TP.

Figure 7:
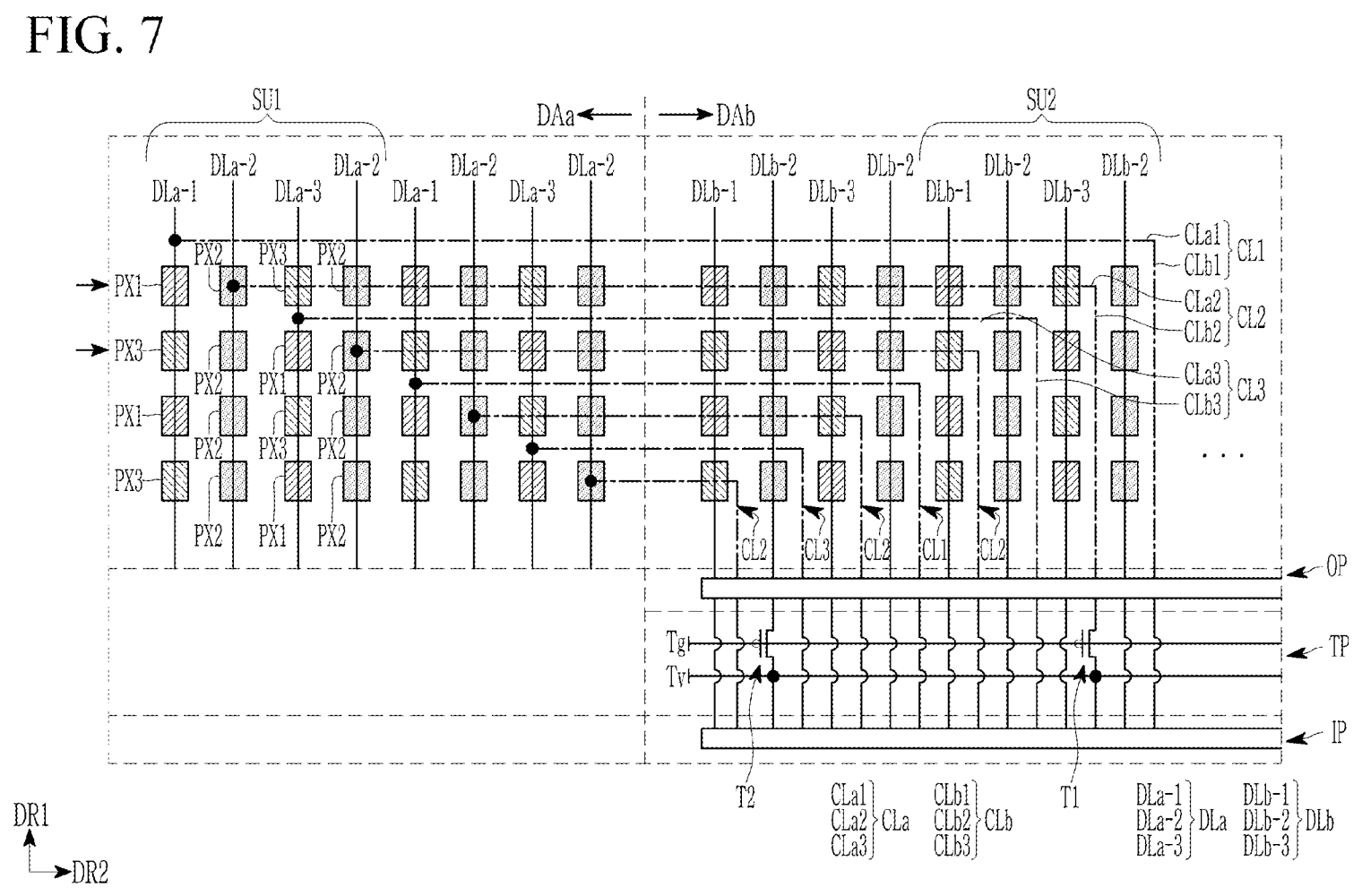

Next, referring to FIG. 7, in an embodiment, any one of a plurality of sub-signal lines included in at least two first signal line units SU1 may be connected to the test circuit portion TP. In an embodiment, one first-2 sub-signal line DLa-2 among eight sub-signal lines included in the two first signal line units SU1 may be connected to the test circuit portion TP. The second connection line CL2 connected to the first-2 sub-signal line DLa-2 may be connected to the test circuit portion TP.

In addition, in an embodiment, any one of a plurality of sub-signal lines included in at least two second signal line units SU2 may be connected to the test circuit portion TP. In an embodiment, one second-2 sub-signal line DLb-2 among eight sub-signal lines included in the two second signal line units SU2 may be connected to the test circuit portion TP.

According to the embodiment illustrated in FIG. 7, in the display areas DAa and DAb, one sub-signal line for every eighth sub-signal lines disposed along the second direction DR2 may be connected to the test circuit portion TP. In this case, the pixels connected to the test circuit portion TP may emit light having a same color. In an embodiment, the pixels may be the second pixels PX2, for example.

Figure 8:
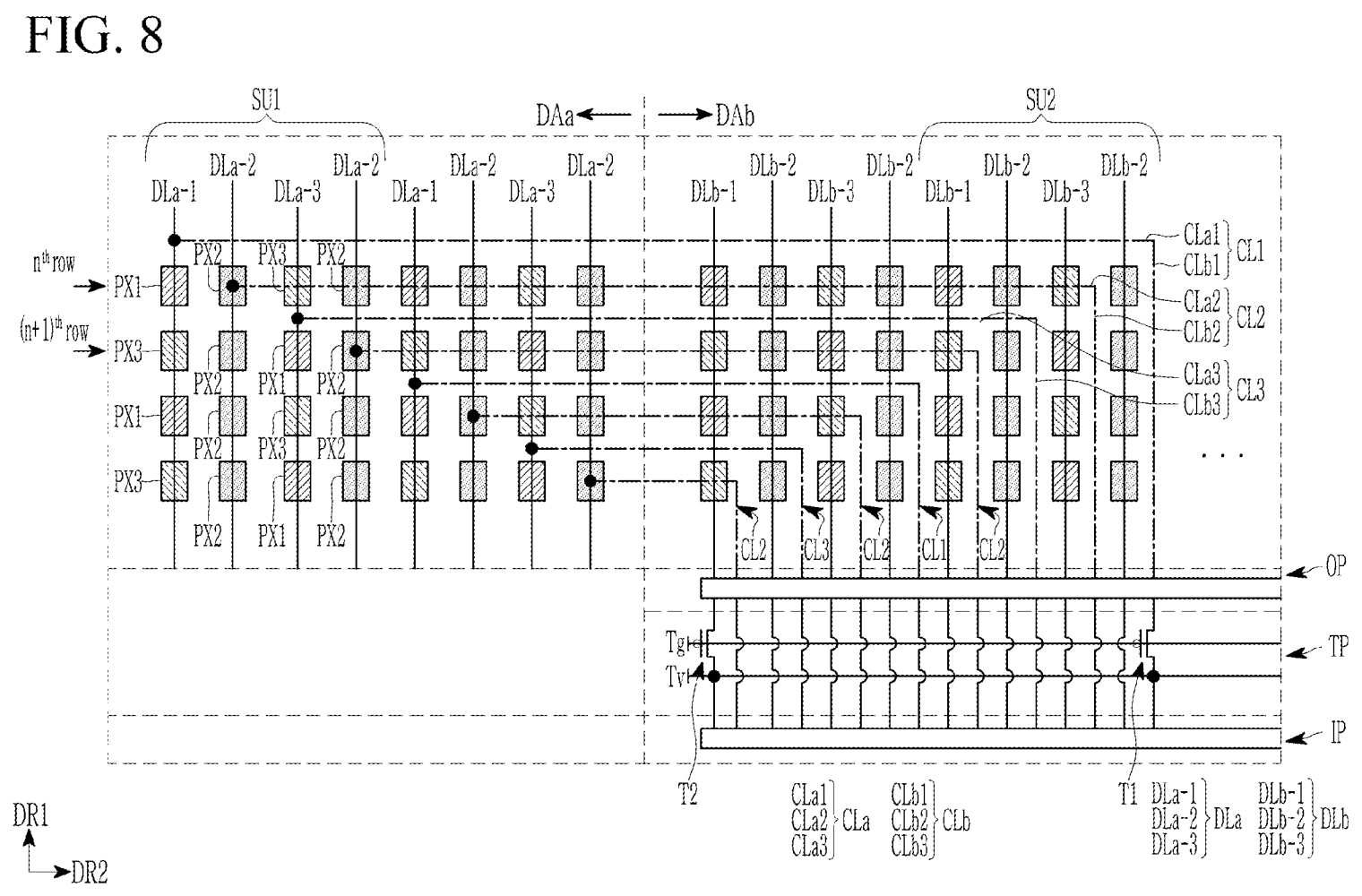

Next, referring to FIG. 8, in an embodiment, any one of a plurality of sub-signal lines included in at least two first signal line units SU1 may be connected to the test circuit portion TP. In an embodiment, one first-1 sub-signal line DLa-1 among eight sub-signal lines included in the two first signal line units SU1 may be connected to the test circuit portion TP. The first connection line CL1 connected to the first-1 sub-signal line DLa-1 may be connected to the test circuit portion TP.

In addition, in an embodiment, any one of a plurality of sub-signal lines included in at least two second signal line units SU2 may be connected to the test circuit portion TP. In an embodiment, one second-1 sub-signal line DLb-1 among eight sub-signal lines included in the two second signal line units SU2 may be connected to the test circuit portion TP.

According to the embodiment illustrated in FIG. 8, in the display areas DAa and DAb, one sub-signal line for every eighth sub-signal lines disposed along the second direction DR2 may be connected to the test circuit portion TP.

Figure 9:
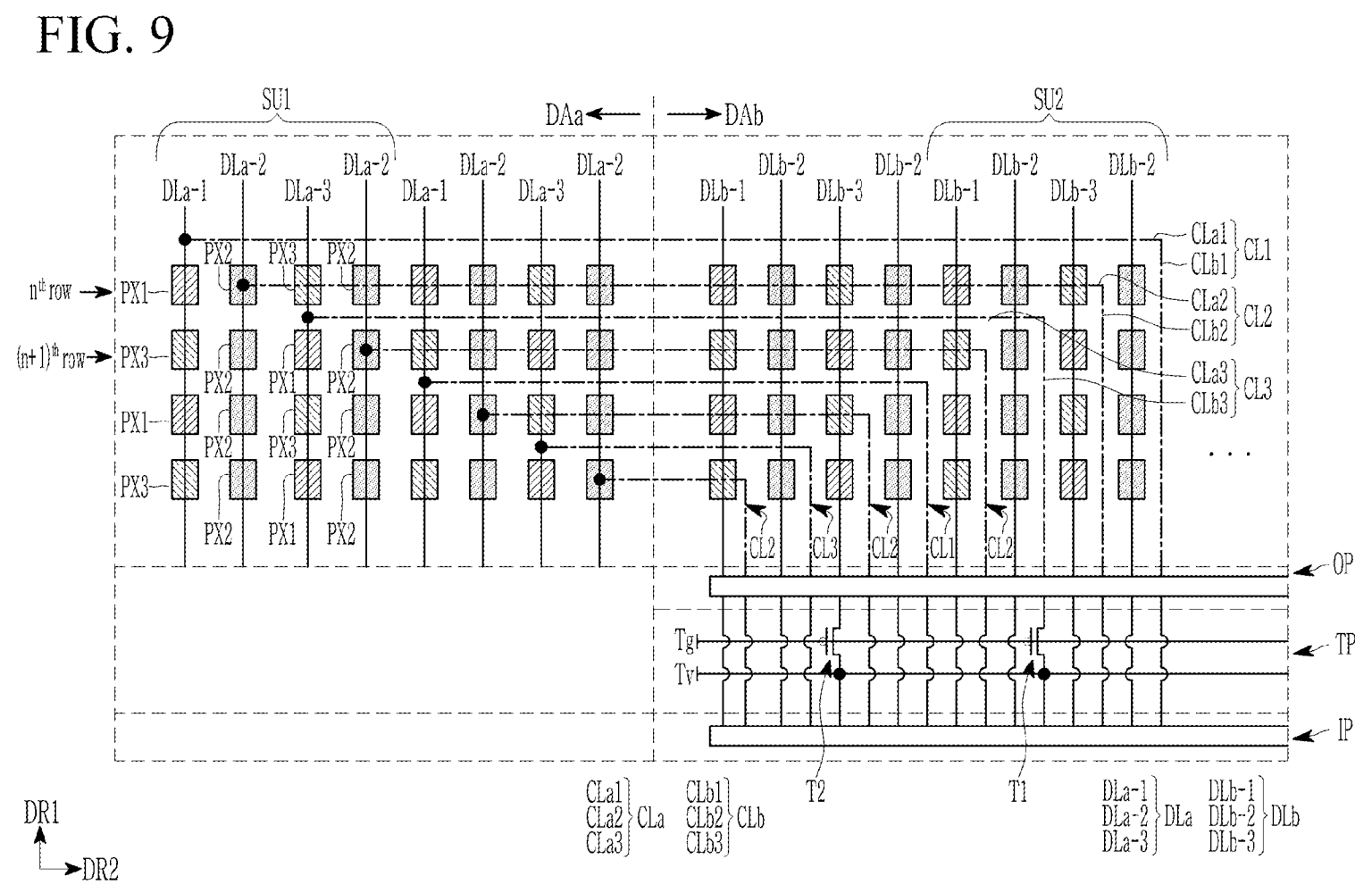

Next, referring to FIG. 9, in an embodiment, any one of a plurality of sub-signal lines included in at least two first signal line units SU1 may be connected to the test circuit portion TP. In an embodiment, one first-3 sub-signal line DLa-3 among eight sub-signal lines included in the two first signal line units SU1 may be connected to the test circuit portion TP. The third connection line CL3 connected to the third-3 sub-signal line DLa-3 may be connected to the test circuit portion TP.

In addition, in an embodiment, any one of a plurality of sub-signal lines included in at least two second signal line units SU2 may be connected to the test circuit portion TP. In an embodiment, one second-3 sub-signal line DLb-3 among eight sub-signal lines included in the two second signal line units SU2 may be connected to the test circuit portion TP.

According to the embodiment illustrated in FIG. 9, in the display areas DAa and DAb, one sub-signal line for every eighth sub-signal lines disposed along the second direction DR2 may be connected to the test circuit portion TP.

Figure 10:
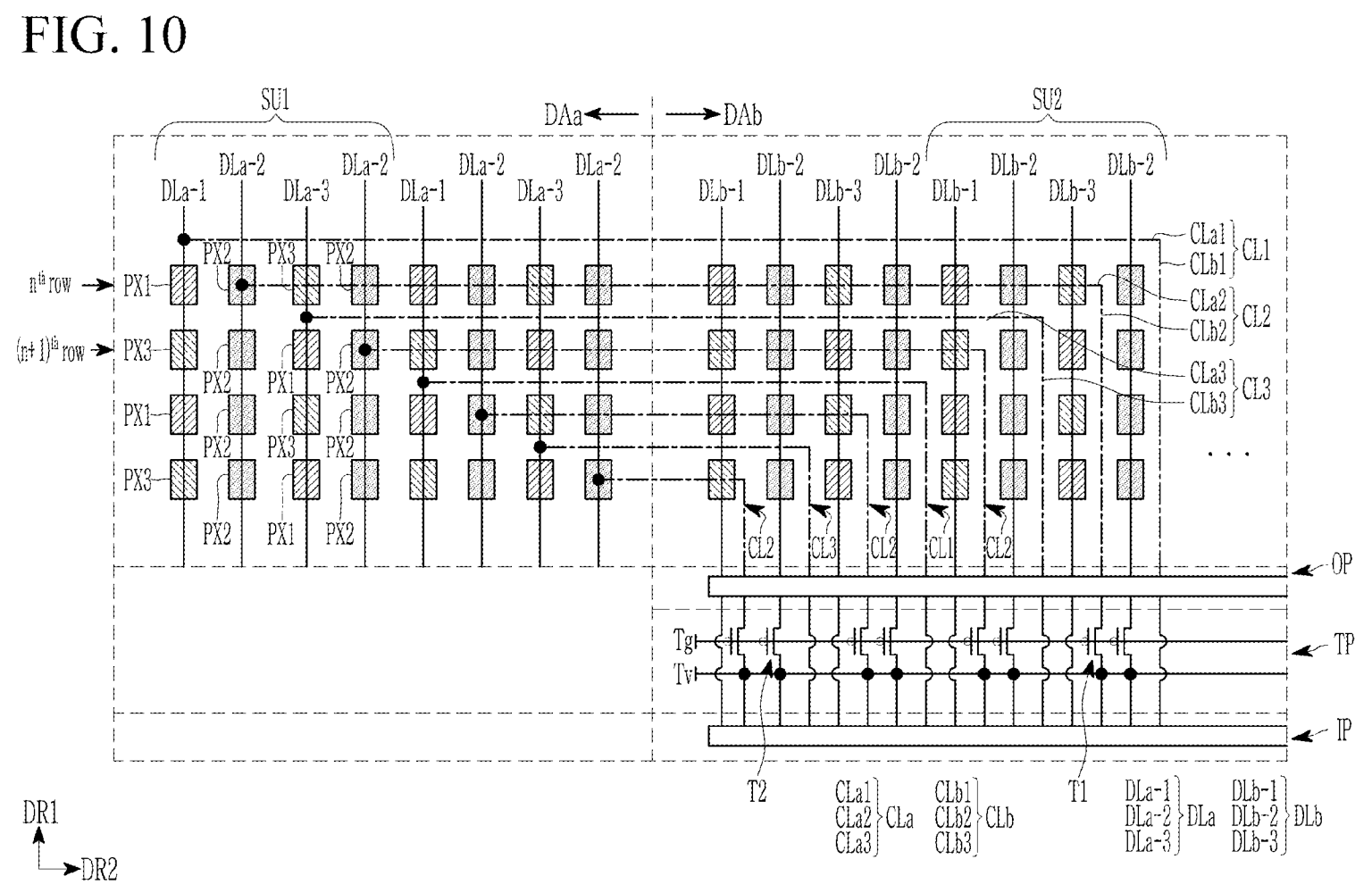

Next, referring to FIG. 10, in an embodiment, at least two sub-signal lines of one first signal line unit SU1 may be connected to the test circuit portion TP. In an embodiment, two first-2 sub-signal lines DLa-2 included in the first signal line unit SU1 may be connected to the test circuit portion TP. The second connection line CL2 electrically connected to each of the first-2 sub-signal lines DLa-2 may be connected to the test circuit portion TP.

In addition, at least two sub-signal lines of one second signal line unit SU2 may be connected to the test circuit portion TP. In an embodiment, two second-2 sub-signal lines DLb-2 included in the second signal line unit SU2 may be connected to the test circuit portion TP.

In an embodiment, in the display areas DAa and DAb, one sub-signal line for every two sub-signal lines along the second direction DR2 may be connected to the test circuit portion TP. In this case, the pixels connected to the test circuit portion TP may emit light having a same color. In an embodiment, the pixels may be the second pixels PX2.

Figure 11:
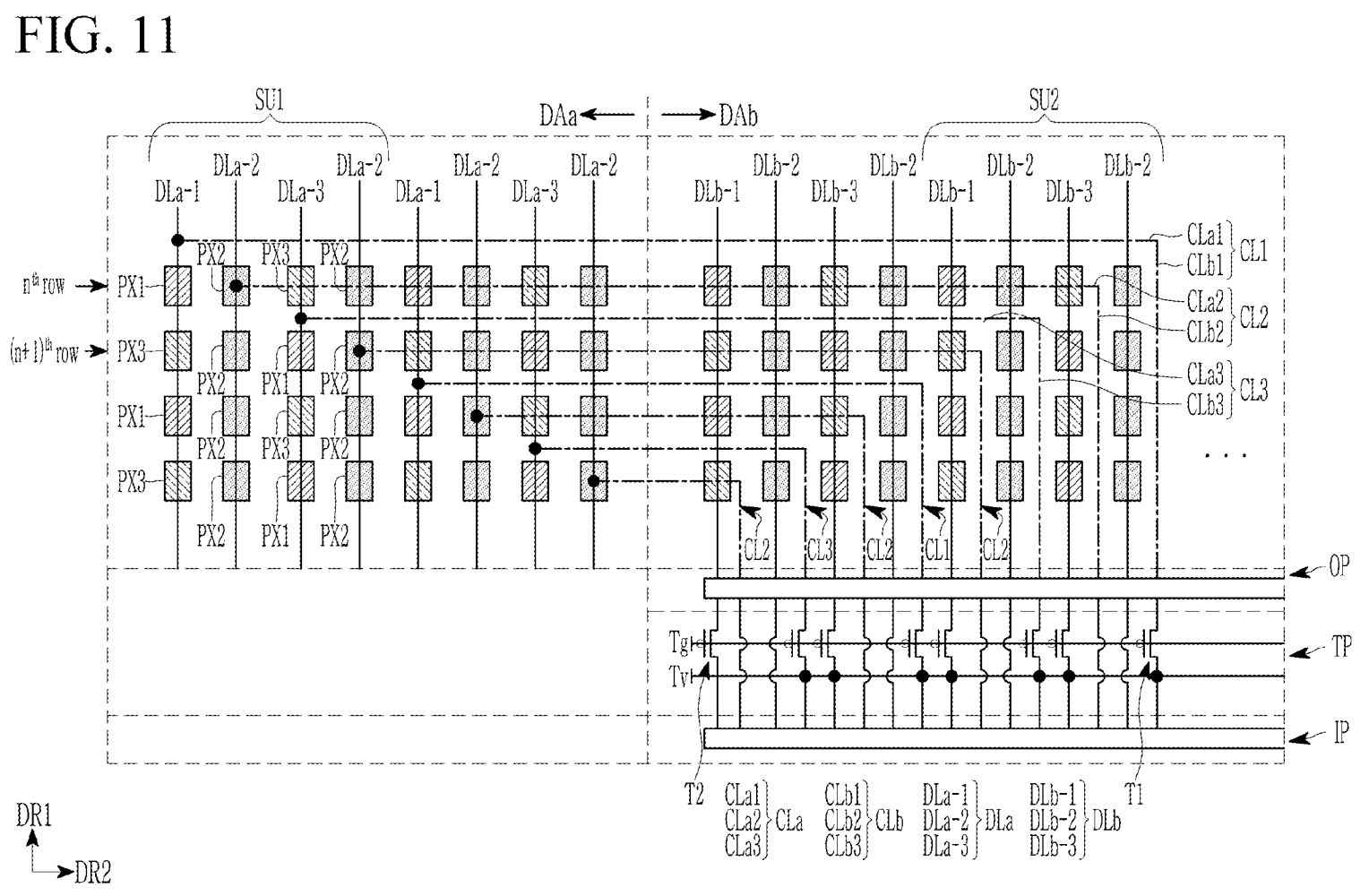

Next, referring to FIG. 11, in an embodiment, at least two sub-signal lines of one first signal line unit SU1 may be connected to the test circuit portion TP. In an embodiment, each of the first-1 sub-signal line DLa-1 and the first-3 sub-signal line DLa-3 included in the first signal line unit SU1 may be connected to the test circuit portion TP. The first connection line CL1 connected to the first-1 sub-signal line DLa-1 and the third connection line CL3 connected to the first-3 sub-signal line DLa-3 may be connected to the test circuit portion TP.

In addition, at least two sub-signal lines of one second signal line unit SU2 may be connected to the test circuit portion TP. In an embodiment, each of the second-1 sub-signal line DLb-1 and the second-3 sub-signal line DLb-3 included in the second signal line unit SU2 may be connected to the test circuit portion TP.

In an embodiment, one sub-signal line for every two sub-signal lines along the second direction DR2 may be connected to the test circuit portion TP.

Figure 12:
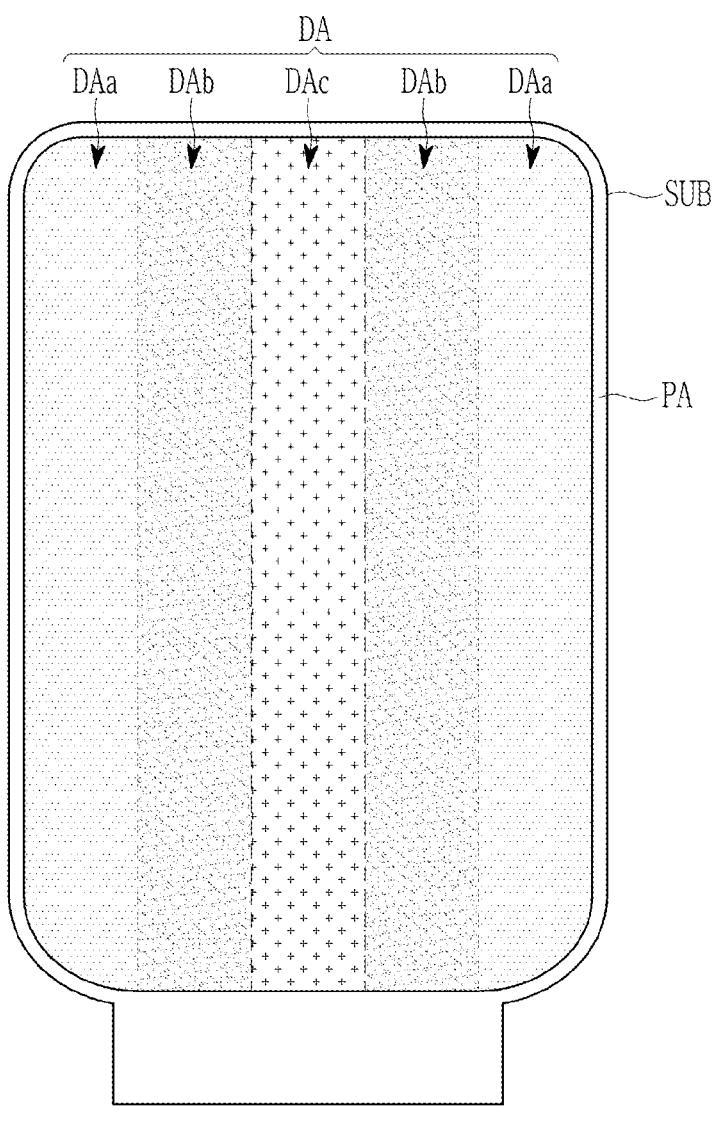
FIG. 12 illustrates a diagram of an embodiment of in which regions are divided depending on disposal of signal lines in a display device.
Figure 12:
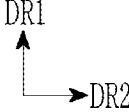
Figure 13:
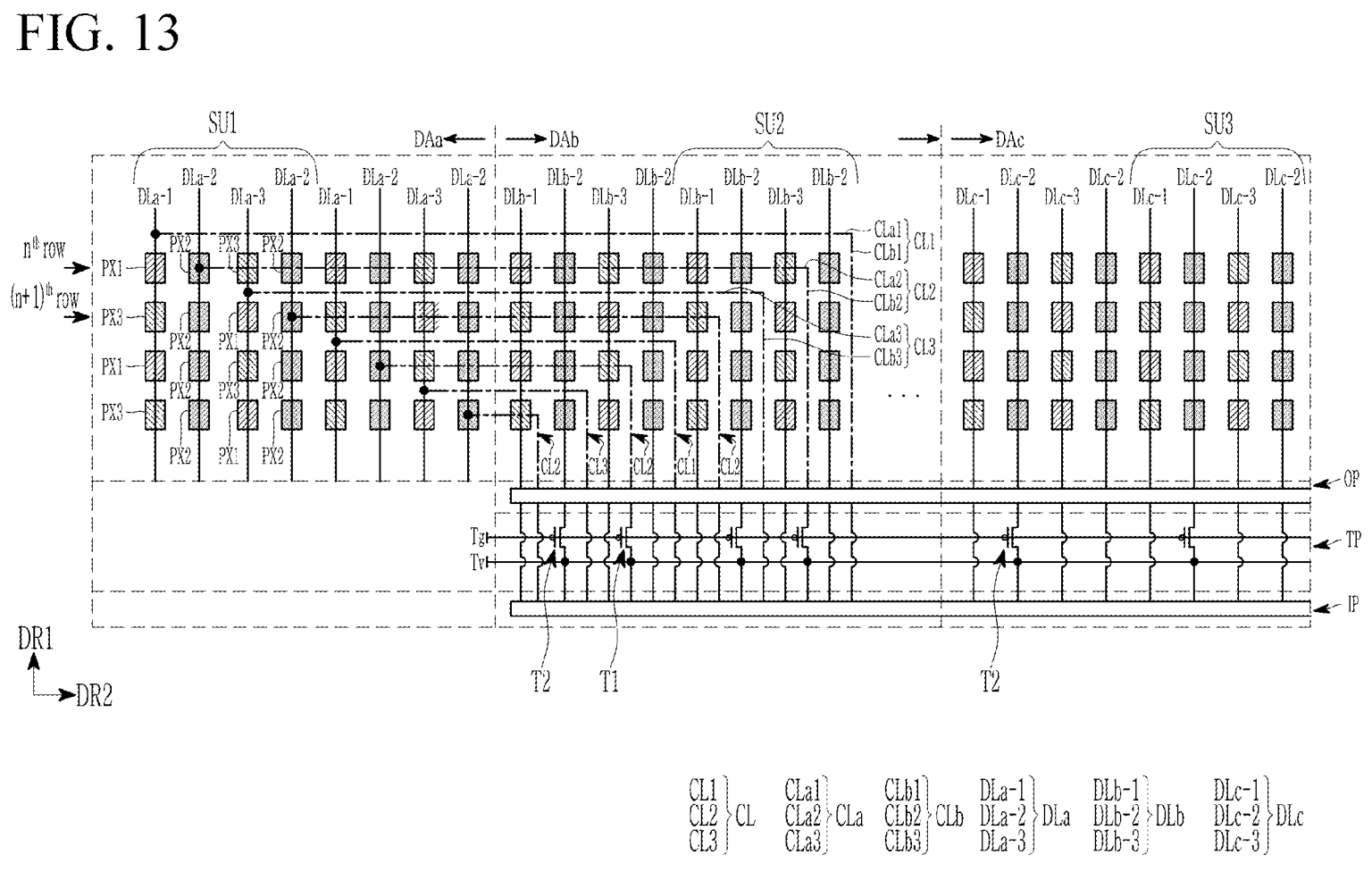

Hereinafter, a display device in an embodiment will be described with reference to FIG. 12 and FIG. 13. FIG. 12 illustrates a schematic plan view of a display device in an embodiment, in which regions depending on a line disposal are divided, and FIG. 13 schematically illustrate disposal of signal lines disposed in a display area and a non-display area. A description of the same or similar constituent elements as those described above will be omitted.

Referring to FIG. 12, the display area DA may include a first display area DAa, a second display area DAb, and a third display area DAc. The third display area DAc is disposed in a middle portion of the display area DA based on a center of the display area DA, and the second display area DAb may be disposed at opposite sides of the third display area DAc. The first display area DAa may be disposed at a right side of the second display area DAb disposed at a right side, and the first display area DAa may be disposed at a left side of the second display area DAb disposed at a left side. Widths of the first display area DAa, the second display area DAb, and the third display area DAc may vary.

As illustrated in FIG. 13, a plurality of first signal lines DLa and the connection line CL may be disposed in the first display area DAa, a plurality of second signal lines DLb and the connection line CL may be disposed in the second display area DAb, and a plurality of third signal lines DLc may be disposed in the third display area DAc. Hereinafter, this will be described in more detail.

The pixels PX may be disposed in the first and second directions DR1 and DR2 in the first display area DAa, the second display area DAb, and the third display area DAc. In an embodiment, a first pixel PX1, a second pixel PX2, a third pixel PX3, and a second pixel PX2 are repeatedly disposed along the second direction DR2 based on an $n^{th}$ row. In addition, the third pixel PX3, the second pixel PX2, the first pixel PX1, and the second pixel PX2 may be repeatedly disposed in an $(n+1)^{th}$ row. The first pixel PX1 is a pixel emitting a first color, the second pixel PX2 is a pixel emitting a second color, and the third pixel PX3 is a pixel emitting a third color. The first color may be red, the second color may be green, and the third color may be blue.

A plurality of first signal lines DLa extending in the first direction DR1 may be disposed in the first display area DAa. The first signal lines DLa may be disposed along the second direction DR2.

The first signal lines DLa may include a first-1 sub-signal line DLa-1 connected to the first pixel PX1 emitting the first color, a first-2 sub-signal line DLa-2 connected to the second pixel PX2 emitting the second color, and a first-3 sub-signal line DLa-3 connected to the third pixel PX3 emitting the third color, based on the $n^{th}$ row.

A plurality of second signal lines DLb extending in the first direction DR1 may be disposed in the second display area DAb. The second signal lines DLb may be disposed along the second direction DR2.

The second signal lines DLb may include a second-1 sub-signal line DLb-1 connected to the first pixel PX1 emitting the first color, a second-2 sub-signal line DLb-2 connected to the second pixel PX2 emitting the second color, and a second-3 sub-signal line DLb-3 connected to the third pixel PX3 emitting the third color, based on the $n^{th}$ row.

In addition, in an embodiment, a connection line CL may be disposed in the first display area DAa and the second display area DAb. The connection line CL may extend to the first display area DAa over the second display area DAb. The connection line CL may extend from the non-display area PA, may pass through the second display area DAb, and may be connected to the first signal lines DLa disposed in the first display area DAa. The connection line CL may overlap the first display area DAa and the second display area DAb, and may be spaced apart from the third display area DAc. The connection line CL may not overlap the third display area DAc.

A plurality of third signal lines DLc extending in the first direction DR1 may be disposed in the third display area DAc. The third signal lines DLc may be disposed along the second direction DR2.

The third signal lines DLc may include a third-1 sub-signal line DLc-1 connected to the first pixel PX1 emitting the first color, a third-2 sub-signal line DLc-2 connected to the second pixel PX2 emitting the second color, and a third-3 sub-signal line DLc-3 connected to the third pixel PX3 emitting the third color, based on the $n^{th}$ row.

The third-1 sub-signal line DLc-1, the third-2 sub-signal line DLc-2, the third-3 sub-signal line DLc-3, and the third-2 sub-signal line DLc-2 may constitute one third signal line unit SU3. A plurality of third signal line units SU3 may be repeatedly disposed in the third display area DAc.

Hereinafter, signal lines and connection lines electrically connected to the test circuit portion TP among a plurality of signal lines and connection lines will be described.

In an embodiment, any one sub-signal line of one first signal line unit SU1 may be connected to the test circuit portion TP. In an embodiment, one first-2 sub-signal line DLa-2 included in the first signal line unit SU1 may be connected to the test circuit portion TP. The second connection line CL2 electrically connected to the first-2 sub-signal line DLa-2 may be connected to the test circuit portion TP.

In addition, any one sub-signal line of one second signal line unit SU2 may be connected to the test circuit portion TP. In an embodiment, one second-2 sub-signal line DLb-2 included in the second signal line unit SU2 may be connected to the test circuit portion TP.

In addition, any one sub-signal line of one third signal line unit SU3 may be connected to the test circuit portion TP. In an embodiment, one third-2 sub-signal line DLb-2 included in the third signal line unit SU3 may be connected to the test circuit portion TP.

In an embodiment, in the display areas DAa, DAb, and DAc, one sub-signal line for every four sub-signal lines along the second direction DR2 may be connected to the test circuit portion TP. In this case, the pixels connected to the test circuit portion TP may emit same light, and may be, e.g., the second pixels PX2 emitting light representing the second color.

In the specification, although the embodiment in which the first-2 sub-signal line DLa-2, the second-2 sub-signal line DLb-2, and the third-2 sub-signal line DLc-2 connected to the second pixel PX2 are connected to the test circuit portion TP has been illustrated and described, it is not limited thereto, and an embodiment in which sub-signal lines connected to the first pixel PX1 are connected to the test circuit portion TP based on the $n^{th}$ row, or sub-signal lines connected to the third pixel PX3 are connected to the test circuit portion TP is also possible.

Figure 14:
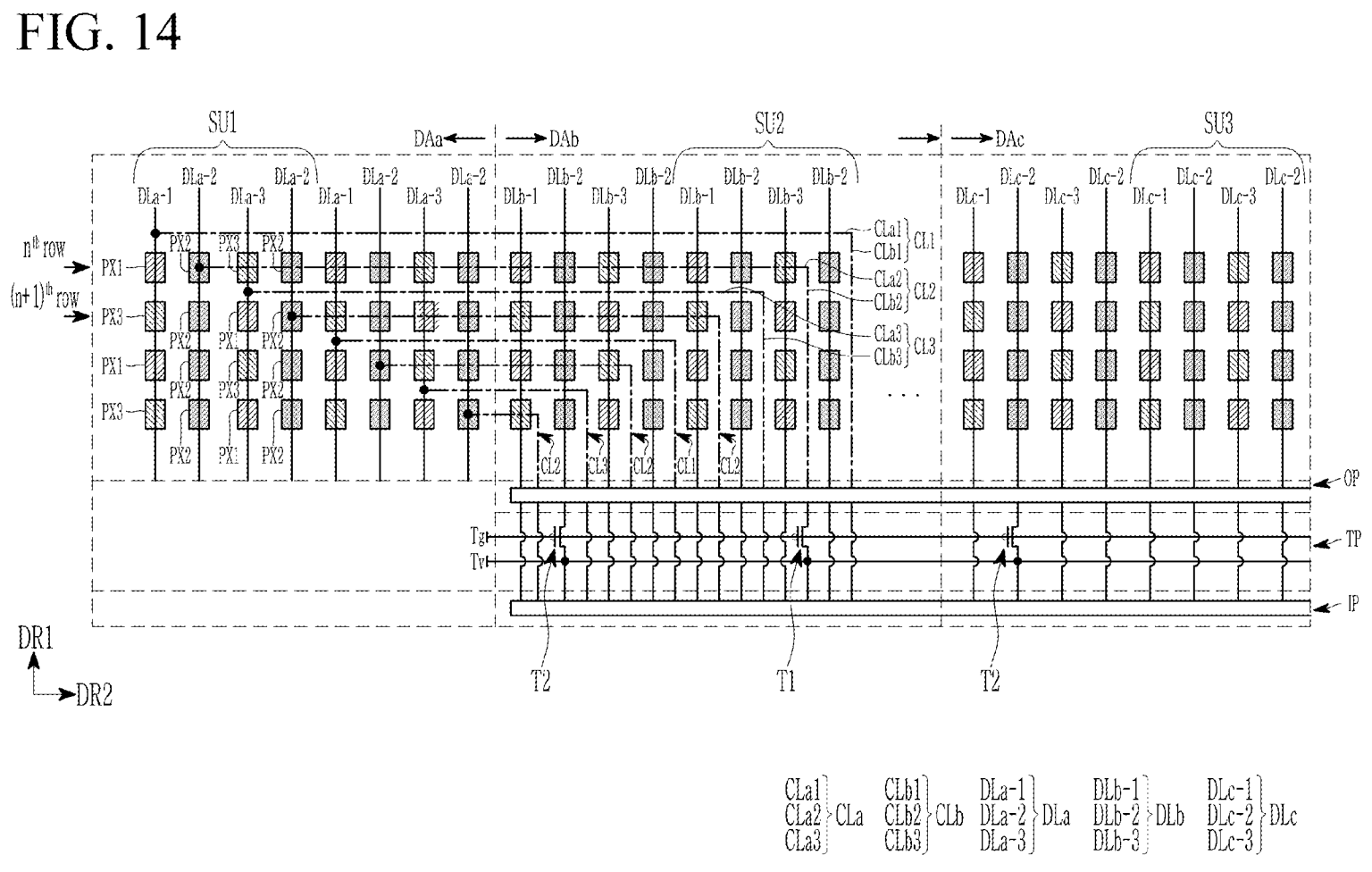
Figure 15:
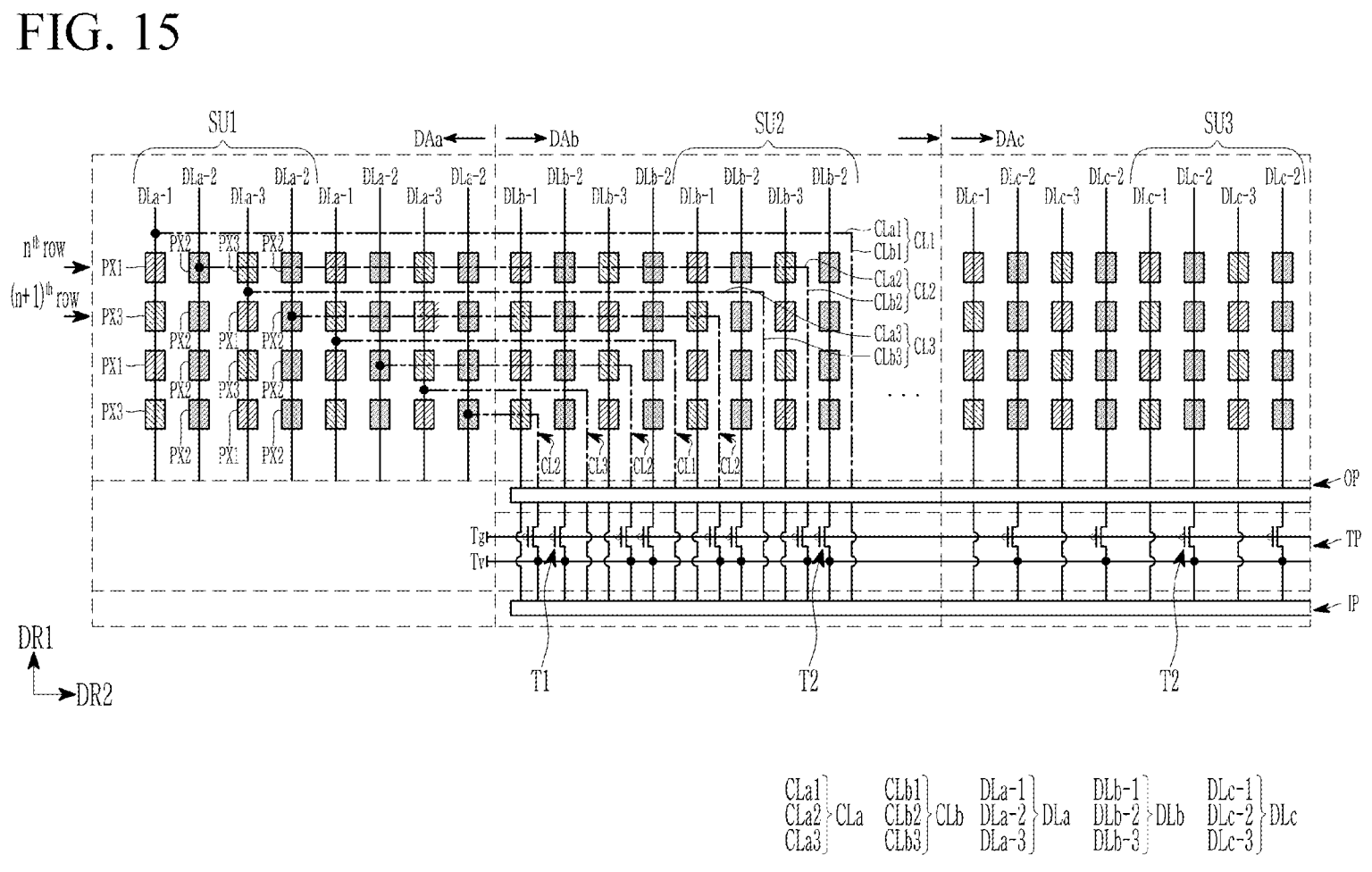

In an embodiment, the test circuit portion TP may be electrically connected to signal lines disposed in the first display area DAa, the second display area DAb, and the third display area DAc to determine whether each of the signal lines is defective. In an embodiment, the test circuit portion TP may be able to test whether the entire display area is defective, and thus a display device with improved reliability may be provided. Hereinafter, a display device in an embodiment will be described with reference to FIG. 14 and FIG. 15. FIG. 14 and FIG. 15 each schematically illustrate disposal of signal lines in a display area and a non-display area. A description of the same or similar constituent elements as those described above will be omitted.

Referring to FIG. 14, in an embodiment, any one of a plurality of sub-signal lines included in at least two first signal line units SU1 may be connected to the test circuit portion TP. In an embodiment, one first-2 sub-signal line DLa-2 among eight sub-signal lines included in the two first signal line units SU1 may be connected to the test circuit portion TP. The second connection line CL2 connected to the first-2 sub-signal line DLa-2 may be connected to the test circuit portion TP.

In addition, in an embodiment, any one of a plurality of sub-signal lines included in at least two second signal line units SU2 may be connected to the test circuit portion TP. In an embodiment, one second-2 sub-signal line DLb-2 among eight sub-signal lines included in the two second signal line units SU2 may be connected to the test circuit portion TP.

In addition, in an embodiment, any one of a plurality of sub-signal lines included in at least two third signal line units SU3 may be connected to the test circuit portion TP. In an embodiment, the third-2 sub-signal line DLc-2 among eight sub-signal lines included in the two third line units SU3 may be connected to the test circuit portion TP.

According to the embodiment illustrated in FIG. 14, in the display areas DAa, DAb, and DAc, one sub-signal line for every eight sub-signal lines disposed along the second direction DR2 may be connected to the test circuit portion TP. In this case, the pixels connected to the test circuit portion TP may emit light having a same color. In an embodiment, the pixels may be the second pixels PX2, for example.

In the specification, although the embodiment in which the first-2 sub-signal line DLa-2, the second-2 sub-signal line DLb-2, and the third-2 sub-signal line DLc-2 connected to the second pixel PX2 are connected to the test circuit portion TP has been illustrated and described, it is not limited thereto, and an embodiment in which sub-signal lines connected to the first pixel PX1 are connected to the test circuit portion TP based on the $n^{th}$ row, or sub-signal lines connected to the third pixel PX3 are connected to the test circuit portion TP is also possible.

Next, referring to FIG. 15, in an embodiment, at least two sub-signal lines of one first signal line unit SU1 may be connected to the test circuit portion TP. In an embodiment, two first-2 sub-signal lines DLa-2 included in the first signal line unit SU1 may be connected to the test circuit portion TP. The second connection line CL2 electrically connected to each of the first-2 sub-signal lines DLa-2 may be connected to the test circuit portion TP.

In addition, at least two sub-signal lines of one second signal line unit SU2 may be connected to the test circuit portion TP. In an embodiment, two second-2 sub-signal lines DLb-2 included in the second signal line unit SU2 may be connected to the test circuit portion TP.

In addition, at least two sub-signal lines of one third signal line unit SU3 may be connected to the test circuit portion TP. In an embodiment, two third-2 sub-signal lines DLb-2 included in the third signal line unit SU3 may be connected to the test circuit portion TP.

In an embodiment, in the display areas DAa, DAb, and DAc, one sub-signal line for every two sub-signal lines along the second direction DR2 may be connected to the test circuit portion TP. In this case, the pixels connected to the test circuit portion TP may emit light having a same color. In an embodiment, the pixels may be the second pixels PX2, for example.

In the specification, although the embodiment in which the first-2 sub-signal line DLa-2, the second-2 sub-signal line DLb-2, and the third-2 sub-signal line DLc-2 connected to the second pixel PX2 are connected to the test circuit portion TP has been illustrated and described, it is not limited thereto, and an embodiment in which sub-signal lines connected to the first pixel PX1 are connected to the test circuit portion TP based on the $n^{th}$ row, or sub-signal lines connected to the third pixel PX3 are connected to the test circuit portion TP is also possible.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

15

What is claimed is:

1. A display device comprising:
a substrate including a first display area, a second display area, and a non-display area;
a plurality of first signal lines extending in a first direction and disposed in the first display area;
a plurality of second signal lines extending from the non-display area in the first direction and disposed in the second display area;
a plurality of connection lines connected to the plurality of first signal lines and extending to the non-display area via the first display area and the second display area; and
a chip mounting area disposed in the non-display area, the chip mounting area including:
a driving integrated circuit which drives the plurality of first signal lines and the plurality of second signal lines; and
a test circuit portion disposed in the non-display area,
wherein at least some of the plurality of connection lines and at least some of the plurality of second signal lines are electrically connected to the test circuit portion,
each of the plurality of first signal lines and the plurality of second signal lines includes a first end and a second end which is closer to the test circuit portion than the first end is, and
the second end of at least one of the plurality of first signal lines is physically separated from the chip mounting area.

2. The display device of claim 1, wherein
the plurality of first signal lines includes:
a first-1 sub-signal line connected to a first pixel emitting a first color;
a first-2 sub-signal line connected to a second pixel emitting a second color; and
a first-3 sub-signal line connected to a third pixel emitting a third color,
the plurality of second signal lines includes:
a second-1 sub-signal line connected to a first pixel emitting the first color;
a second-2 sub-signal line connected to a second pixel emitting the second color; and
a second-3 sub-signal line connected to a third pixel emitting the third color,
a first signal line unit in which the first-1 sub-signal line, the first-2 sub-signal line, the first-3 sub-signal line, and the first-2 sub-signal line are disposed is repeatedly disposed in the first display area, and
a second signal line unit in which the second-1 sub-signal line, the second-2 sub-signal line, the second-3 sub-signal line, and the second-2 sub-signal line are disposed is repeatedly disposed in the second display area.

3. The display device of claim 2, wherein
one of the first-1, first-2, first-3 sub-signal lines included in the first signal line unit and one of the second-1, second-2 and second-3 sub-signal lines included in the second signal line unit are connected to the test circuit portion.

4. The display device of claim 3, wherein
one first-2 sub-signal line included in the first signal line unit and one second-2 sub-signal line included in the second signal line unit are connected to the test circuit portion.

5. The display device of claim 3, wherein
the first-1 sub-signal line of the first signal line unit and the second-1 sub-signal line of the second signal line unit are connected to the test circuit portion.

6. The display device of claim 3, wherein
the first-3 sub-signal line of the first signal line unit and the second-3 sub-signal line of the second signal line unit are connected to the test circuit portion.

7. The display device of claim 2, wherein
the two first-2 sub-signal lines included in the first signal line unit and the two second-2 sub-signal lines included in the second signal line unit are connected to the test circuit portion.

8. The display device of claim 2, wherein
the first-1 sub-signal line and the first-3 sub-signal line included in the first signal line unit and the second-1 sub-signal line and the second-3 sub-signal line included in the second signal line unit are connected to the test circuit portion.

9. The display device of claim 2, wherein
the first signal line unit is provided in plural,
the second signal line unit is provided in plural, and
one of the first-1, first-2, first-3 sub-signal lines included in at least two first signal line units and one of the second-1, second-2 and second-3 sub-signal lines included in at least two second signal line units are connected to the test circuit portion.

10. The display device of claim 1, wherein
the plurality of connection lines has different lengths from each other.

11. The display device of claim 10, wherein
the plurality of connection lines is spaced apart from each other in the first display area and the second display area, and do not cross each other.

12. The display device of claim 10, wherein
each of the plurality of connection lines includes:
a first sub-connection line extending along a second direction which is perpendicular to the first direction; and
a second sub-connection line extending along the first direction and connected to the first sub-connection line,
wherein the first sub-connection line overlaps the plurality of second signal lines.

13. A display device comprising:
a substrate including a first display area, a second display area, a third display area, and a non-display area;
a plurality of first signal lines extending in a first direction and disposed in the first display area;
a plurality of second signal lines extending from the non-display area in the first direction and disposed in the second display area;
a plurality of third signal lines extending from the non-display area in the first direction and disposed in the third display area;
a plurality of connection lines connected to the plurality of first signal lines and extending to the non-display area via the first display area and the second display area; and
a chip mounting area disposed in the non-display area, the chip mounting area including:
a driving integrated circuit which drives the plurality of first signal lines, the plurality of second signal lines and the plurality of third signal lines; and
a test circuit portion disposed in the non-display area,
wherein at least some of the plurality of connection lines, at least some of the plurality of second signal lines, and at least some of the plurality of third signal lines are electrically connected to the test circuit portion,
each of the plurality of first signal lines, the plurality of second signal lines and the third signal lines includes a first end and a second end which is closer to the test circuit portion than the first end is, and the second end of at least one of the plurality of first signal lines is physically separated from the chip mounting area.

14. The display device of claim 13, wherein the plurality of connection lines overlaps the first display area and the second display area, and are spaced apart from the third display area.

15. The display device of claim 13, wherein the plurality of first signal lines includes:

a first-1 sub-signal line connected to a first pixel emitting a first color;

a first-2 sub-signal line connected to a second pixel emitting a second color; and a first-3 sub-signal line connected to a third pixel emitting a third color, the plurality of second signal lines includes:

a second-1 sub-signal line connected to a first pixel emitting the first color;

a second-2 sub-signal line connected to a second pixel emitting the second color; and a second-3 sub-signal line connected to a third pixel emitting the third color, the plurality of third signal lines includes:

a third-1 sub-signal line connected to a first pixel emitting the first color;

a third-2 sub-signal line connected to a second pixel emitting the second color; and a third-3 sub-signal line connected to a third pixel emitting the third color, and a first signal line unit in which the first-1 sub-signal line, the first-2 sub-signal line, the first-3 sub-signal line, and the first-2 sub-signal line are disposed is repeatedly disposed in the first display area, a second signal line unit in which the second-1 sub-signal line, the second-2 sub-signal line, the second-3 sub-signal line, and the second-2 sub-signal line are disposed is repeatedly disposed in the second display area, and a third signal line unit in which the third-1 sub-signal line, the third-2 sub-signal line, the third-3 sub-signal line, and the third-2 sub-signal line are disposed is repeatedly disposed in the third display area.

16. The display device of claim 15, wherein one of the first-1, first-2, first-3 sub-signal lines of the first signal line unit, one of the second-1, second-2 and second-3 sub-signal lines of the second signal line unit, and one of the third-1, third-2 and third-3 sub-signal lines of the third signal line unit are connected to the test circuit portion.

17. The display device of claim 16, wherein a plurality of pixels electrically connected to the test circuit portion emits light of a same color.

18. The display device of claim 15, wherein the two first-2 sub-signal lines included in the first signal line unit, the two second-2 sub-signal lines included in the second signal line unit, and the two third-2 sub-signal lines included in the third signal line unit are connected to the test circuit portion.

19. The display device of claim 15, wherein the first-1 sub-signal line and the first-3 sub-signal line included in the first signal line unit, the second-1 sub-signal line and the second-3 sub-signal line included in the second signal line unit, and the third-1 sub-signal line and the third-3 sub-signal line included in the third signal line unit are connected to the test circuit portion.

20. The display device of claim 15, wherein the first signal line unit is provided in plural, the second signal line unit is provided in plural, third signal line unit is provided in plural, and one of the first-1, first-2, first-3 sub-signal lines included in at least two first signal line units, one of the second-1, second-2 and second-3 sub-signal lines included in at least two second signal line units, and one of the third-1, third-2 and third-3 sub-signal lines included in at least two third signal line units are connected to the test circuit portion.

* * * * *